United States Patent [19]
Salles et al.

[11] 3,866,311

[45] Feb. 18, 1975

[54] METHOD OF PROVIDING ELECTRICALLY ISOLATED OVERLAPPING METALLIC CONDUCTORS

[75] Inventors: Henri J. Salles, Palo Alto; David R. Newby, Cupertino, both of Calif.

[73] Assignee: National Semiconductor Corporation, Santa Clara, Calif.

[22] Filed: June 18, 1973

[21] Appl. No.: 370,925

Related U.S. Application Data

[62] Division of Ser. No. 152,531, June 14, 1971, abandoned.

[52] U.S. Cl. .......................... 29/578, 29/590, 204/15

[51] Int. Cl. .............................................. B01j 17/00

[58] Field of Search ...... 29/577, 578, 590; 117/212, 117/217; 148/6.27; 204/15

[56] References Cited

UNITED STATES PATENTS

| | | | |
|---|---|---|---|
| 3,039,898 | 6/1962 | Keller | 148/6.27 |
| 3,398,335 | 8/1968 | Dill | 29/578 |
| 3,461,347 | 8/1969 | Lemelson | 204/15 |
| 3,508,325 | 4/1970 | Perry | 29/577 |
| 3,634,203 | 1/1972 | McMahon | 204/15 |

*Primary Examiner*—Roy Lake
*Assistant Examiner*—W. C. Tupman

[57] ABSTRACT

A method of simplifying metallic interconnection between the various components comprising an integrated circuit formed on s semiconductor wafer by selectively oxidizing a first set of interconnecting metallic conductors formed on the wafer surface and then forming a second set of conductors in overlying relationship with the oxidized conductors, the two sets of conductors being electrically insulated from each other by the layer of oxidation formed over the first set. The first set of conductors are oxidized by immersion in an aqueous bath heated to a temperature of between 40°C and 100°C for a selected period of time.

9 Claims, 9 Drawing Figures

METHOD OF PROVIDING ELECTRICALLY ISOLATED OVERLAPPING METALLIC CONDUCTORS

This is a division, of application Ser. No. 152,531, filed June 14, 1971 and now abandoned.

BACKGROUND OF THE INVENTION

1. Field of the Invention

The present invention relates generally to integrated circuit methods and apparatus and more particularly to a method of simplifying the metallic interconnection between the various microcircuit components on a single wafer by selectively oxidizing certain interconnecting metallic conductors and then forming other conductors in crossing relationship over the oxidized conductors.

2. Description of the Prior Art

One of the factors which seriously limits the microminiaturization of integrated circuits involves the problem of providing metal interconnects between the various semiconductor regions forming the components of the circuit. Since the conductors must be spaced apart far enough so as to prevent shorting between adjacent conductors, the provision of interconnects to the various regions presents a substantial problem which, in some cases, limits the number of discrete elements which can be provided on a wafer of a particular size.

Although the designer attempts to lay out the circuit so that no conductor crossovers are necessary, sometimes crossovers are unavoidable. One way of providing for crossovers is to intercept one of the conductors and provide a diffused conductive region beneath the path of the other intersecting conductor, with the broken conductor ohmically contacting the region on either side of the continuous conductor. This method, however, takes up chip area, increases interconnect impedance, and parasitic capacitance. Another method, which enables crossover without consuming chip area, involves the provision of two layers of interconnects, each insulated from the other by a layer of dielectric material with all metallized strips of the second layer being connected to the underlying first metal layer through openings in the dielectric layer. Using this latter method, the device is built up through a final oxide opening masking step (which allows metallic interconnections to be extended through openings in the thermal oxide to contact the components of the integrated circuit) and a first layer of aluminum is evaporated over the entire wafer surface. This first aluminum layer is then masked using conventional photolithographic techniques wherein the unwanted metal is removed leaving strips of interconnect metal in an array covering all of the openings through the thermal oxide. A dielectric layer is then deposited over the entire surface of the wafer (covering both the thermal oxide and the aluminum interconnects) using a low temperature deposition process. A dielectric masking step (feedthrough mask) is then used to provide openings in the insulating dielectric layer through which contact can be made to selected aluminum strips of the first metal layer. A second layer of metal is then evaporated over the surface and conventional masking techniques (second metal mask) are used to delineate the second layer interconnect conductors. Whenever conductors must cross other conductors on the original layout, a conductor segment in the second layer is used to provide a bridge connecting an interrupted conductor in the first layer. This process may be continued for any number of layers until interconnecting paths are provided to the various regions on the wafer. Note that for each layer of conductors at least two masking steps are required.

SUMMARY OF THE PRESENT INVENTION

It is therefore an object of the present invention to provide a simplified process for forming microcircuit interconnecting conductors in overlapping relationship on the surface of an integrated circuit wafer.

In accordance with the present invention, an integrated circuit wafer which has been fabricated up through the oxide opening masking step, and thus has a thermal oxide layer provided over the surface with contact openings provided therethrough, is provided with a first set of metal conductors and the wafer is then exposed to an oxidizing agent which selectively oxidizes only the metal conductors, and does not cause further oxidization of the wafer. As one example, the wafer is immersed in a solution of deionized (DI) water, which has been heated to a temperature between 40°C and 100°C, and is left therein for a period of time sufficient to grow a hydrated oxide of a selected thickness over the exposed surfaces of the conductors. Because of the low temperatures involved, no additional oxide is grown over the thermal oxide and no oxidation of the exposed semiconductor surface area occurs. The wafer is then removed from the deionized water and a second set of interconnecting conductors is provided on the surface with at least some of the conductors overlying those in the first set but being electrically insulated therefrom by the hydrated oxide. If additional sets of interconnects are required, the second and subsequent sets of conductors are likewise selectively oxidized by immersion in the heated DI water before the overlying conductors are deposited.

Among the advantages of the present invention is that the manufacturing process is simplified substantially, as compared with prior art methods, due to the elimination of one masking step per additional metal layer.

Another advantage of the present invention is that the structural character of the resulting device is not as complex as the equivalent prior art structure.

An incidental advantage of the present invention is that the same technique can be used to provide capacitor devices on the upper surface of the wafer.

These and other objects of the present invention will no doubt become apparent to those skilled in the art after having read the following detailed description of the preferred embodiments which are illustrated in the several figures of the drawing.

IN THE DRAWING

DETAILED DESCRIPTION OF THE PREFERRED EMBODIMENTS

Figure 1:
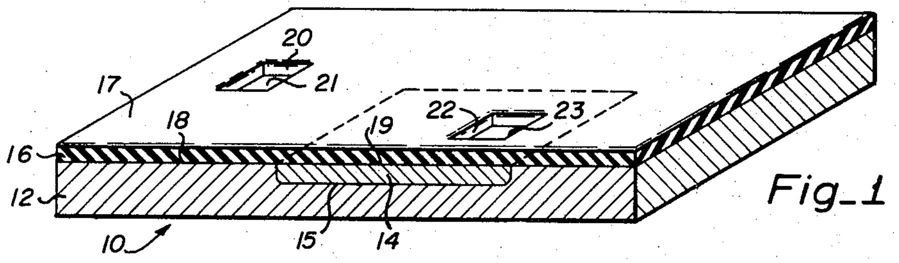
FIGS. 1, 2 and 4 are perspective diagrams
Figure 2:
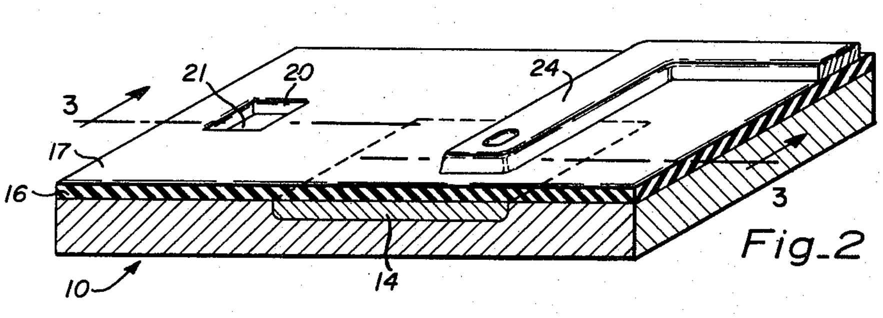

Referring now to FIG. 1 of the drawing, there is shown a simplified segment of a semiconductor wafer 10 of the type typically formed in making integrated circuits. The wafer, as illustrated, has been processed up through the oxide opening masking stage in accordance with well-known contemporary prior art techniques, one of which is disclosed in the U.S. Pat. No. to B. T. Murphy 3,321,340. Other prior art techniques are disclosed in the Motorola publication "Integrated Circuits-Design Principals and Fabrication" published by McGraw-Hill. Wafer 10 includes a first body 12 of one conductivity type having a second body 14 of the opposite conductivity type diffused thereinto to form a pn junction 15 therebetween. A layer of thermally grown dielectric oxide 16 is provided overlying relationship to the upper surfaces 18 of body 12 and 19 of body 14. An opening 20 is provided through the thermal oxide layer 16 to expose a portion 21 of surface 18, and a similar opening 22 is provided in oxide 16 to expose a portion 23 of surface 19. Where it is not possible to provide conductors ohmically contacting each of the surface portions 21 and 23 without having the conductors overlap one another, a first conductor 24, or first layer of conductors, is provided as illustrated in FIG. 2 by depositing, such as by evaporation, a suitable metal, such as aluminum, over the entire surface 17 of oxide 16 and then using well-known photomasking techniques removing all of the metal layer except the portion forming conductor 24. Note that even though during the first metallization operation a quantity of metal was deposited into opening 20, this metal was removed during the photomasking operation leaving portion 21 of the surface 18 of body 12 fully exposed and unoxidized. The metal used to form conductor 24 may be of any suitable material which adheres well to the surface 17, provides good ohmic contacts with the semiconductive body 14, and may be selectively oxidized in the manner discussed below.

Figure 3:
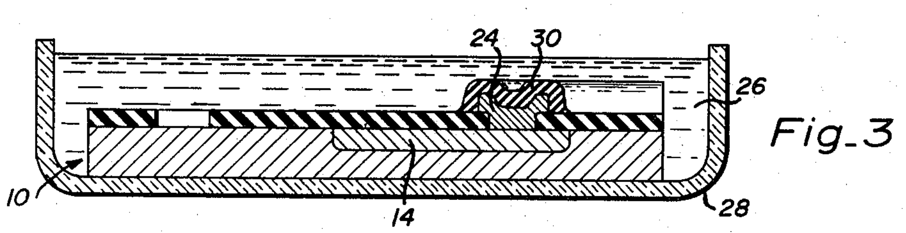
FIG. 3 is a cross-sectional diagram which sequentially illustrate in simplified form the method of the present invention.
Figure 4:
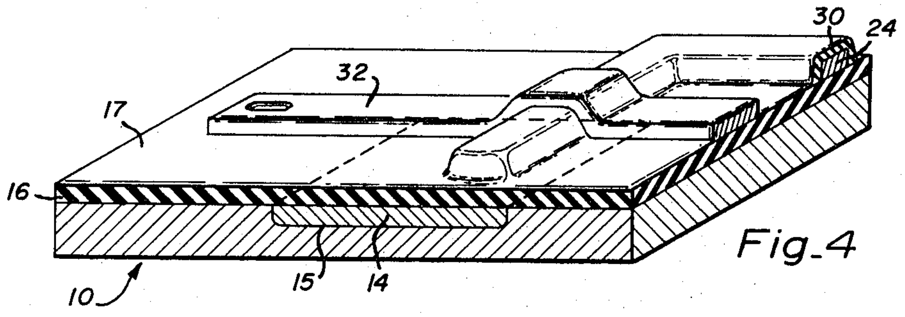

The wafer 10 is then alloyed in a nitrogen atmosphere at approximately the eutectic temperature to form a good ohmic contact between conductor 24 and surface portion 23. Wafer 10 is then exposed to an oxidizing agent of a type which selectively oxidizes conductor 24 without oxidizing surface portion 21 or further oxidizing layer 16. For example, as illustrated in FIG. 3, wafer 10 may be immersed in a bath of a quantity of DI water 26 which is contained within a suitable container 28 and is heated to a temperature of between 40°C and 100°C. Wafer 10 is then left immersed in the bath for a period of from ¼ hr. to 4 hrs. or more until an oxide of a selected thickness is formed thereon. Whereas the lower end of the temperature range has been found to be slow in producing the oxide and the higher end of the temperature range has been found to produce oxides with low dielectric qualities, optimum temperature for DI water 26 during the period of immersion has been found to be approximately 70°C. During the time that wafer 10 is immersed, oxidation of the exposed surfaces of conductor 24 occurs as the metal reacts with the DI water. As the surface metal is consumed, a layer of hydrated oxide 30 (hydrated aluminum oxide, for example) is formed over the surface of conductor 24. Tests have shown that approximately 1500A of metal is consumed during a 4 hr. immersion of the wafer, when the DI water is held at approximately 70°C, thereby producing an hydrated aluminum oxide layer having a thickness of approximately 3000A. Alternatively, instead of immersing the wafer in a bath, the wafer may be exposed to a heated highly saturated oxidizing vapor for a period sufficient to cause the desired oxide growth. Accordingly, the term "solution" as used in the claims is deemed to include an oxidizing agent in its gaseous as well as liquid state.

Wafer 10 is then removed from the bath and a second layer of metal is evaporated over surface 17 as well as the oxide coated conductor 24. A second metal mask is then utilized to delineate a second conductor 32 which extends in crossing relationship over conductor 24. Conductor 32 is, however, electrically insulated from conductor 24 by the oxide layer 30. The device is then alloyed in a nitrogen atmosphere at a temperature slightly less than the previously used alloying temperature but still close enough to the eutectic temperature to form a good ohmic contact between surface portion 21 and conductor 32. The lower alloying temperature is used in this and any subsequent alloying stages so as not to cause damage to the oxide layer 30 (by preventing further growth of aluminum hillock). After the contact is formed, the device is complete, an electrical current path is established from conductor 32 through body 12, through pn junction 15 into body 14, and out through conductor 24. The oxide layer 30 when of a thickness of about 3000A is sufficient to withstand a voltage of approximately 400 volts without breaking down.

Monolithic capacitors in integrated circuits can be made by diffusing a region of appropriate conductivity type material into a portion of the semiconductor surface, covering the surface with an oxide layer and then disposing a metallic plate (conductive layer) above the oxide. The diffused region, however, must be isolated from other devices formed in the surrounding substrate and where the diffused "plate" is to be electrically connected to other than circuit ground (the substrate potential), ohmic contacts must be provided. In addition to occupying valuable chip surface area, such devices are usually voltage limited to less than 100 volts due to the dielectric breakdown characteristics of the oxide layer serving as the dielectric material.

Figure 5:
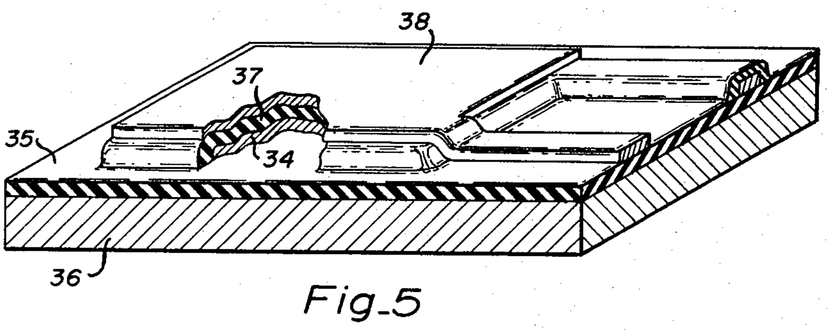
FIG. 5 is a perspective diagram which illustrates a capacitor structure made in accordance with the present invention.

Since the present invention enables two electrical conductors having intersecting paths to be disposed in electrically isolated relationship on a single surface, it will be appreciated that the above described process can likewise be used to provide a surface located capacitor element including a lower plate 34, an insulating oxide layer 37 and an upper plate 38 such as is illustrated in FIG. 5 of the drawing. For example, the lower plate 34 can be formed on the insulated surface 35 of a semiconductive wafer 36 using the conventional metallization and photolithographic techniques referred to above, and the oxide layer 37 can be formed by immersing the device in a heated aqueous solution, such as DI water, for a selected period of time. After removal of the device from the aqueous solution, the upper plate 38 is formed using the same metal evaporation and photolithographic techniques used to form the lower plate 34.

The advantages of such a device are substantial. For example, the capacitor can be formed over other diffused components, the surface configuration can be chosen to "fit" into the metallic interconnect scheme and the device has a high voltage handling capability (approximately 400 volts or greater).

Figure 6:
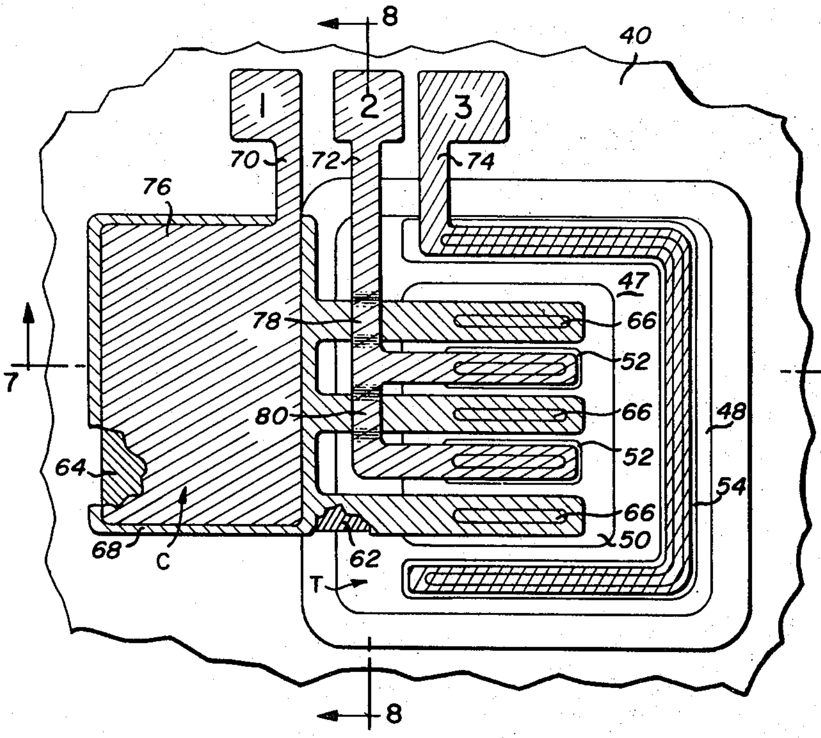
FIG. 6 is a top view illustrating an exemplary embodiment of an integrated circuit device made in accordance with the present invention.
Figure 6A:
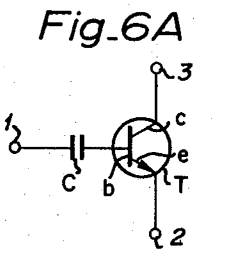
FIG. 6A is an electrical schematic of the device illustrated in FIG. 6.
Figure 7:
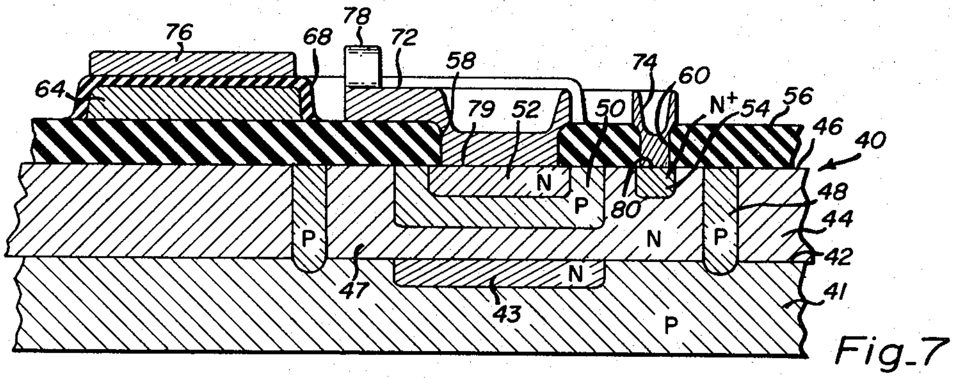
FIGS. 7 and 8 are cross sections taken through the device illustrated in FIG. 6.
Figure 8:
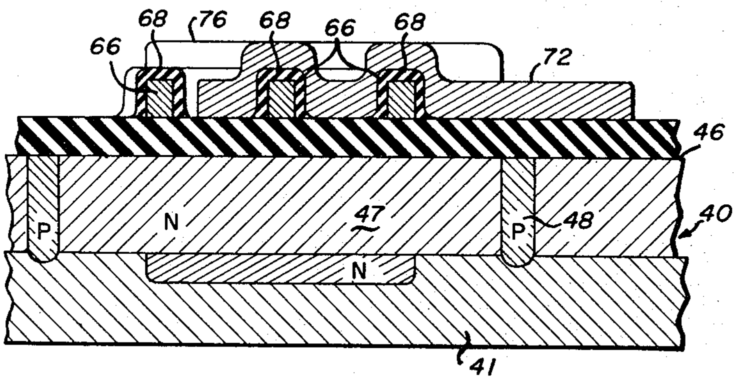

Turning now to FIGS. 6–8 of the drawing, the advantages of the present invention will be illustrated in terms of a particular bipolar integrated circuit example. FIG. 6 is a plan view showing a wafer segment 40 having formed therein an NPN transistor with a surface capacitor provided in the base circuit in accordance with the present invention. FIGS. 7 and 8 are cross sections taken along the lines 7—7 and 8—8, respectively, of FIG. 6. As an aid in understanding the circuit interconnections shown in FIG. 6, a schematic equivalent circuit is shown in FIG. 6A which includes a terminal 1 capacitively coupled by the capacitor C to the base *b* of the NPN transistor T, an emitter terminal 2 connected to the emitter *e*, and a collector terminal 3 connected to the collector *c*.

Transistor T is formed using the conventional five mask process wherein a substrate 41 of suitable p-type material such as silicon or germanium is prepared and a thermal oxide layer (not shown) is formed on the surface 42. A first photolithographic masking operation is used to provide an opening in the oxide layer through which the buried layer region 43 is formed by impurity deposition and diffusion. The oxide is then stripped away and an n-type layer 44 is epitaxially grown on the surface 42. An oxide layer is thereafter grown on the upper surface 46 of epitaxial layer 44. A second photolithographic masking operation (isolation mask) is used to provide an annular opening in the oxide layer through which the isolation ring 48 is formed by the deposition and diffusion of p-type impurities into epitaxial n-type layer 44. The n-type region 47 thus segregated from the remainder of epitaxial layer 44 provides the collector region for transistor T.

Another oxide layer is then grown upon the previous oxide layer covering surface 46, and a third photolithographic masking operation is used to provide a base opening through which p-type impurities are deposited and diffused into collector region 47 to form the base region 50. The device is then further oxidized and a fourth photolithographic operation (commonly referred to as the emitter mask) is used to provide openings in the oxide layer through which n-type impurities are deposited and diffused into base region 50 and collector region 47 to form the n-type emitter region 52 and n+ collector contact region 54. The device is then further oxidized to form the final oxide layer indicated at 56, and a fifth photolithographic masking process is used to provide the openings 58 (emitter contact) and 60 (collector contact), as well as base contact openings (not shown) into which metal will be deposited to form ohmic contacts with the respective regions during subsequent metallization processes.

Up to this point, the integrated circuit structure has been fabricated using conventional techniques. The device is now ready for the first metallization and is placed in an evaporation chamber so that a layer of aluminum (or other suitable metal) can be evaporated over the entire surface of layer 56 as well as those portions of the semiconductor surface 46 which are exposed through the base, emitter and collector contact openings. A first metal mask (sixth photolithographic operation) is then used to remove all of the metal layer except for three strips 62 which are to form base interconnects and the rectangular portion 64 which forms the first or lower plate of the capacitor C. The device is then alloyed at a temperature of 550°C to form ohmic contacts to base 50 at the three locations 66. The reason that only the base interconnect strips 62 and first capacitive plate 64 were formed during the first metallization is that one of the design restrictions placed on the method of the present invention is that all interconnects which are to be connected to the bonding pads must be formed during the last metallization. The reason for this restriction is that if contact pads were included in earlier formed metallizations, an additional etching step would be required to "uncover" the oxide covered pads.

The device is then exposed to an oxidizing agent which causes oxidation of only the interconnects 62 and plate 64. For example, the device may be placed in an aqueous bath such as shown in FIG. 3 and which is preferably comprised of DI water heated to 73°C. The device is left in the bath for approximately four hours, during which period a layer of hydrated aluminum oxide 68 is formed on the surface of plate 64 and strips 62. Since silicon will not oxidize at such a low temperature, no oxidation occurs at the exposed portion of surface 46 and no further oxidation of oxide layer 56 occurs. After the device is removed from the aqueous bath, a second layer of aluminum is deposited over the entire upper surface, including the oxidized plate 64 and strips 62, and a second metal mask (seventh photolithographic operation) is used to delineate the interconnects 70, 72 and 74, and remove the remainder of the aluminum layer. Note that the portion 76 of interconnect 70 also forms the second or upper capacitive plate of capacitor C, and that interconnect 72 passes directly over the top of two of the oxide coated strips 62 at points 78 and 80 but is electrically isolated therefrom by the oxide coatings 68 (see FIG. 9). The emitter interconnect 72 ohmically contacts the semiconductor surface at 79 (FIG. 7), and collector interconnect 74 ohmically contacts the *n*+ collector contact region at 80.

Not only does the method of the present invention enable the provision of a more compact device by permitting the overlapping of interconnect conductors and by simplifying the process (by eliminating one masking step per additional metal layer), but it provides a means for adding a capacitor having a high voltage breakdown capability which is located externally of the semiconductor body thus allowing the semiconductor region lying therebeneath to be used for other purposes.

Although the present invention has been described in terms of several simplified examples, it is to be understood that the process can be extended to applications other than those illustrated. For example, the substrate onto which the first metallic layer is deposited could be of other configurations; for example, such as cylindrical so that a coaxial conductor or coaxial capacitor would be formed. Furthermore, it is to be understood that the term oxidizing agent used in the claims is intended to mean any material which reacts with the metallic interconnects used, but does not react with the thermal oxide or semiconductor surface. Accordingly, it is intended that the appended claims be interpreted as covering all modifications and adaptations of the present inventive process as fall within the true spirit and scope of the invention.

What is claimed is:

1. A method of making a semiconductive device having overlying metallic interconnects, comprising the steps of:

developing a semiconductive body including at least two semiconductive portions of opposite conductivity type terminating at a surface of said body and forming a pn junction therebetween;

growing a thermal oxide layer on said surface;

providing a first opening through said oxide layer above said first portion and a second opening through said oxide layer above said second portion;

forming a first metallic conductor on said thermal oxide layer and in intimate contact therewith and extending through said first opening to ohmically contact said first portion;

exposing said oxide layer with said first conductor to an aqueous solution to form an hydrated oxide only on the exposed surfaces of said conductor; and forming a second conductor on said thermal oxide layer which has at least a portion overlying said first conductor and said hydrated oxide and which extends through said second opening to ohmically contact said second portion, said first and second conductors being electrically isolated from each other by said hydrated oxide.

2. A method as claimed in claim 1 wherein said first metallic conductor is formed of aluminum and said hydrated oxide layer is aluminum oxide.

3. A method of making a semiconductive device having overlying interconnects, comprising the steps of:

developing a semiconductive body including at least two different semiconductive regions, each region terminating at a surface of said body;

forming a first oxide layer on said surface;

providing a first opening in said oxide layer above a first one of said regions and a second opening in said oxide layer above a second one of said regions;

forming a first metallic conductor on said oxide layer and extending through said first opening to ohmically contact said first region;

exposing said surface with said first metallic conductor to an oxidizing agent to form a metallic oxide layer only on the exposed surfaces of said metallic conductor; and forming a second conductor on said first oxide layer which has at least a portion overlying said first conductor and which extends through said second opening to ohmically contact said second region, said second conductor being electrically isolated from said underlying first conductor by said metallic oxide layer.

4. A method as claimed in claim 3 wherein said first metallic conductor is formed of aluminum and said metallic oxide layer is aluminum oxide.

5. A method as claimed in claim 3 wherein the step of forming said first metallic conductor on said first oxide layer comprises forming a layer of said material over the surface of the oxide layer and selectively removing metallic areas to leave said formed first metallic conductor.

6. A method as claimed in claim 5 wherein said first metallic conductor is formed of aluminum and said metallic oxide layer is aluminum oxide.

7. The method of making a semiconductive device having dual layer, overlying metallic interconnections comprising the steps of:

forming an oxide insulation layer over the surface of a semiconductor wafer, the oxide insulation layer having openings extending therethrough to regions of the wafer to which electrically conductive metallic inter-connections are to be made, forming a first metal layer over the surface of said oxide insulation layer and extending through said openings to the wafer surface, removing by photomasking techniques all of said first metal layer except for those portions serving to form a first layer of metallic interconnections extending through certain ones of said openings in said oxide insulation layer, forming a metallic oxide insulation layer on said electrically conductive metallic interconnections in said first layer of interconnections while leaving certain other ones of said openings in said first oxide insulation layer in the opened condition, forming a second metal layer over the surface of said first oxide insulation layer and over the metallic oxide insulation layer on said electrically conductive metallic interconnections in said first layer of metallic interconnections, and removing by photomasking techniques all of said second metal layer except for those portions serving to form a second layer of metallic interconnections extending through said certain other ones of said openings in said first oxide insulation layer, certain of said latter portions overlying certain ones of said insulated metal interconnects in said first layer of metal interconnects.

8. The method as claimed in claim 7 wherein said metallic interconnections in said first layer of metallic interconnections are of aluminum and said metallic oxide layer on said metallic interconnections is aluminum oxide.

9. The method as claimed in claim 8 wherein said aluminum oxide layer is formed by exposing said first layer of interconnections to an oxidizing agent.

* * * * *